United States Patent [19]
Brown

[11] Patent Number: 5,311,077
[45] Date of Patent: May 10, 1994

[54] POWER SUPPLY, TEMPERATURE, AND LOAD CAPACITANCE COMPENSATING, CONTROLLED SLEW RATE OUTPUT BUFFER

[75] Inventor: Michael A. Brown, San Jose, Calif.

[73] Assignee: National Semiconductor Corporation, Santa Clara, Calif.

[21] Appl. No.: 49,793

[22] Filed: Apr. 21, 1993

Related U.S. Application Data

[63] Continuation of Ser. No. 914,294, Jul. 15, 1992, abandoned.

[51] Int. Cl.$^5$ .................. H03K 19/003; H03K 19/08; H03K 19/0175
[52] U.S. Cl. .................................... 307/443; 307/446; 307/310; 307/475
[58] Field of Search ............... 307/263, 270, 443, 446, 307/451, 310, 475, 570

[56] References Cited

U.S. PATENT DOCUMENTS

| | | | |
|---|---|---|---|
| 4,712,021 | 12/1987 | Gollinger | 307/451 |
| 4,724,343 | 2/1988 | Le Roux et al. | 307/475 |
| 4,857,863 | 8/1989 | Gangor et al. | 307/263 |
| 4,947,063 | 8/1990 | O'Shaughnessy et al. | 307/443 |
| 5,021,684 | 6/1991 | Ahuja et al. | 307/263 |

Primary Examiner—Edward P. Westin
Assistant Examiner—Benjamin D. Driscoll
Attorney, Agent, or Firm—Limbach & Limbach

[57] ABSTRACT

A controlled slew rate output buffer has an input stage that generates a charging current in response to the rising edge of an input signal and that generates a discharging current in response to the falling edge of the input signal so that both the charging current and the discharging current are substantially constant over a temperature range and a power supply voltage range. A charging stage responds to the charging current by charging an intermediate node at a first slew rate that is substantially constant over the temperature range and the power supply voltage range. A discharging stage responds to the discharging current by discharging the intermediate node at a second slew rate that is substantially constant over the temperature range and the power supply voltage range. A charging output stage responds to the charging of the intermediate node and charges an output node at a third slew rate that is substantially equivalent to the first slew rate and that is substantially constant over the temperature range, the power supply voltage range, and an output capacitance range. A discharging output stage responds to the discharging of the intermediate node and discharges the output node at a fourth slew rate that is substantially equivalent to the second slew rate and that is substantially constant over the temperature range, the power supply voltage range, and the output capacitance range.

28 Claims, 2 Drawing Sheets

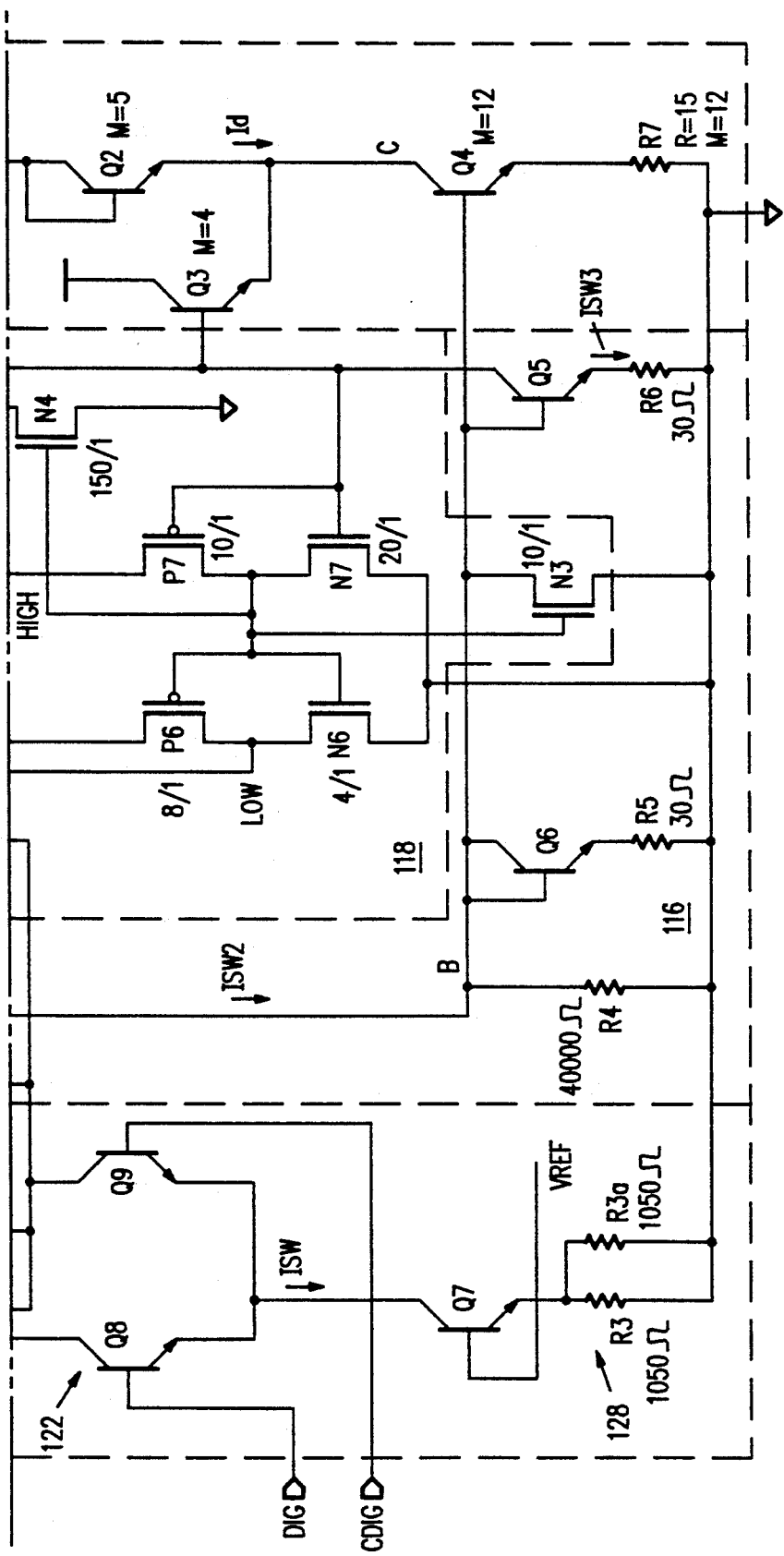
FIG. 1B
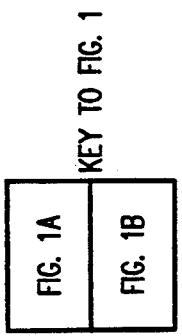
KEY TO FIG. 1
| FIG. 1A |
|---------|
| FIG. 1B |

POWER SUPPLY, TEMPERATURE, AND LOAD CAPACITANCE COMPENSATING, CONTROLLED SLEW RATE OUTPUT BUFFER

This is a continuation of co-pending application Ser. No. 07/914,294 filed on Jul. 15, 1992, now abandoned.

BACKGROUND OF THE INVENTION

1. Field of the Invention

The present invention relates to semiconductor integrated circuits and, in particular, to a TTL-compatible, high-speed output buffer that has a switching delay substantially independent of output loading over a specified loading range and that provides controlled output edge rates that are substantially independent of loading, temperature, supply voltage and edge transition.

2. Description of the Related Art

An output buffer is a circuit which may serve a number of functions. First, output buffers are frequently required to translate an input family of voltages levels to a different output family of voltage levels. Output buffers are also often required to generate TTL compatible output signals even though the output buffer is internally designed with emitter coupled logic. Additionally, output buffers are commonly required to drive heavily capacitively loaded signal and bus lines on a printed circuit board through large voltage swings.

Output buffers which are utilized in complex high speed digital systems are often required to possess not only voltage translation and capacitive drive properties, but are also required to meet tight timing constraints. These timing constraints can include 1) a constant buffer delay which is independent of the output loading, changes in the surrounding temperature, the power supply voltage, and the transition polarity and 2) output edges which exhibit controlled ramp rate characteristics.

The tight timing constraints are especially important when an output buffer is used as an output clock driver buffer. An output clock driver buffer provides critical system clock signals to other integrated circuits on the printed circuit board and may also be fed back into the integrated circuit from which it was generated.

An output clock driver buffer may have multiple drivers wherein each driver drives a clock signal which is phase offset from the other clock signals. Even when each driver has a different output loading, each driver must still meet the critical timing relationships between the different clock signals.

Thus, there is a need for an output buffer which has a fixed delay independent of its loading over temperature and power supply ranges. Since the time required for the output to transition from either high or low or low to high is the major portion of the buffer delay, a buffer which exhibits a controlled output slew rate over variations in loading, temperature, VCC voltage, transition polarity, will be able to meet this critical timing requirement.

In addition to being able to meet critical timing requirements, another advantage to controlled output slew rate is that it can be set to a value which will lead to a minimum of overshooting and undershooting on the output waveform. Buffers with uncontrolled fast edges can, when used in an environment with inductive leads, cause ringing on the output signals, which can cause timing errors in circuits fed by the output. It would, therefore, be desirable to have available an output buffer that provides controllable, smooth output transitions independent of loading, temperature, and polarity of transition.

SUMMARY OF THE INVENTION

The present invention provides a controlled slew rate output buffer that repeats an input signal to an output node of the output buffer. The output buffer includes an input stage that includes a charging leg and a discharging leg that respond to the input signal by alternately providing a current path for a fixed current from a power supply to a current source. A charging stage responds to the current in the charging leg by charging a first node to the high voltage at a rising slew rate that is set by the magnitude of a first charging current and by the capacitance of a capacitor. A discharging stage responds to the current in the discharging leg by discharging the first node to an intermediate low voltage at a falling slew rate that is substantially equivalent to the rising slew rate of the first node. The rising and falling slew rate at the first node is substantially constant over a specified temperature range, a specified power supply range, a specified capacitive loading range, and with substantially equivalent rising and falling slew rates. A holddown stage connected to the first node responds to the discharge of the first node to the intermediate low voltage by pulling the first node to the low voltage and by pulling the output node down to a final low voltage. An output stage connected between the first node and the output node tracks the slew rate at the first node during its charging and discharging stages so that the rising and falling slew rate of the output node is substantially equivalent to the rising and falling slew rate of the first node.

A better understanding of the features and advantages of the present invention will be obtained by reference of the following detailed description and accompanying drawings which set forth an illustrative embodiment in which the principals of the invention are utilized.

BRIEF DESCRIPTION OF THE DRAWINGS

FIGS. 1A and 1B are a circuit diagram illustrating an output buffer in accordance with the present invention.

DETAILED DESCRIPTION

Figure 1A:
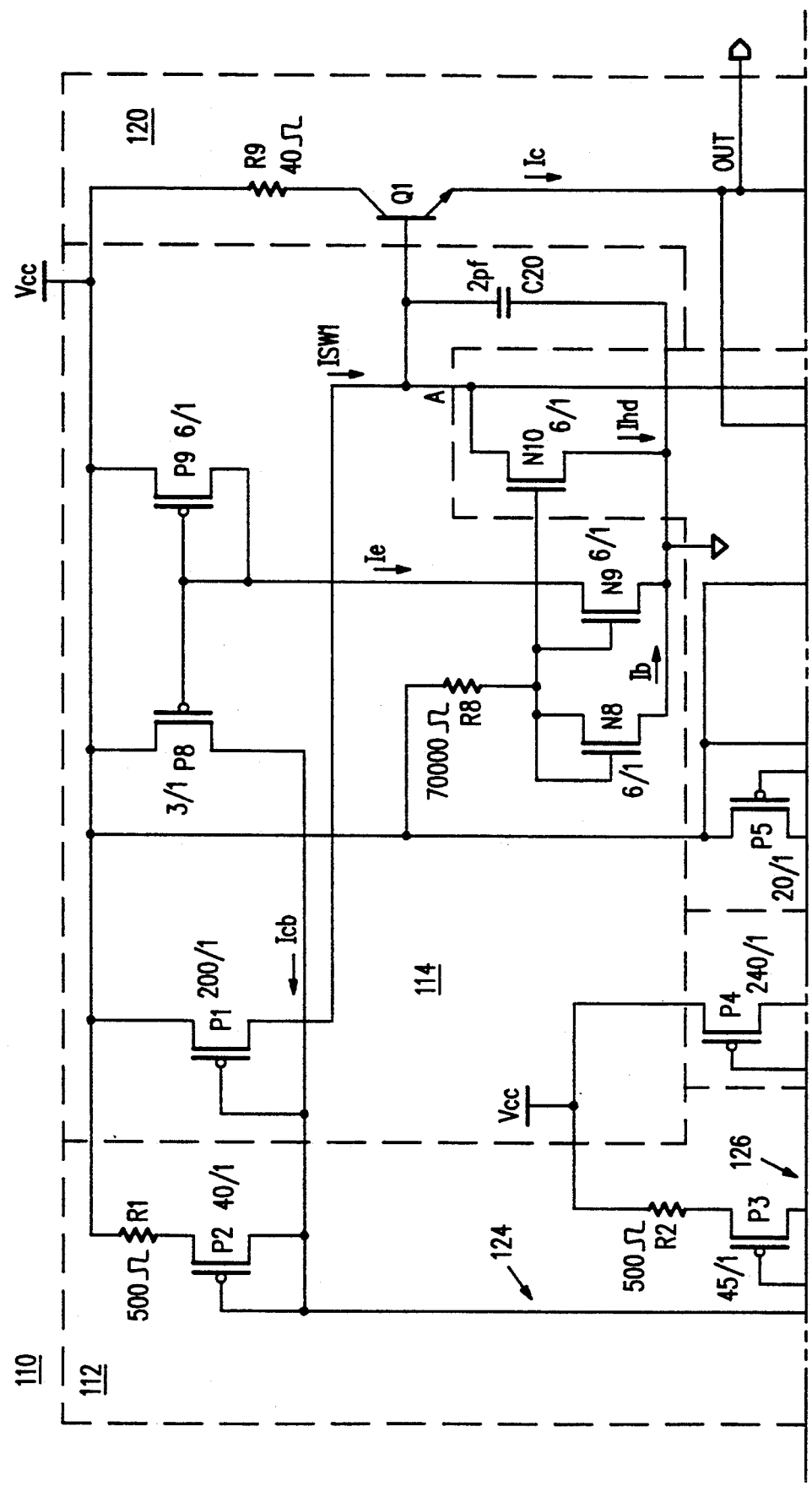

FIGS. 1A and 1B show a non-inverting, controlled slew rate output buffer 110 in accordance with the present invention.

The output buffer 110 includes a differential input stage 112 that receives an input signal DIG which may have a frequency of up to 30 MHz (megahertz). A charging stage 114 generates a voltage at a node A that has a rising slew rate which is substantially set by the capacitance of a capacitor C20 and the magnitude of a first charging current ISW1. A discharging stage 116 discharges the voltage at node A at a falling slew rate that is substantially equivalent to the rising slew rate at node A. The rising and falling slew rates at node A are substantially constant over a temperature range of from −55° C. to +125° C., a power supply range of from 4.5 volts to 5.5 volts, an output capacitive load range of from 15 pF (picofarads) to 65 pF, and with substantially equivalent rising and falling slew rates. A hold-down stage 118 controls the end of the high-to-low voltage transition at node A and at an output node OUT. An output stage 120 tracks the slew rate at node A during the charging and discharging stages so that the rising and falling slew rate of the output node OUT is substantially equivalent to the rising and falling slew rate of node A.

As shown in FIGS. 1A and 1B, the input stage 112 includes a charging leg 124 and a discharging leg 126, each of which alternately provides a current path for a fixed current ISW from a power supply VCC to a current source 128. In the preferred embodiment of the present invention, fixed current ISW is approximately 320 uA (microamperes).

The charging leg 124 includes a p-channel charging transistor P2 having its source connected to the power supply VCC through a charging resistor R1, and a npn charging input transistor Q8 having its collector connected to the commonly-connected gate and drain of charging transistor P2. The base of charging input transistor Q8 is connected to receive the input signal DIG, while its emitter is connected to current source 128.

The discharging leg 126 includes a p-channel diode-connected discharging transistor P3 having its source connected to the power supply VCC through a discharging resistor R2, and a npn discharging input transistor Q9 having its collector connected to the commonly-connected gate and drain of discharging transistor P3. The base of the discharging input transistor Q9 is connected to receive a complimentary input signal CDIG (which is 180 degrees out of phase with input signal DIG). The emitter of transistor Q9 is connected to current source 128.

When the input signal DIG to the base of charging input transistor Q8 is low (approx. 3 volts), transistor Q8 turns off. This causes transistor Q8 and charging transistor P2 to provide substantially none of fixed current ISW sunk by current source 128. On the other hand, when the input signal DIG to charging input transistor Q8 is high (approx. 3.6 volts), transistor Q8 turns on. This causes transistor Q8 and charging transistor P2 to provide substantially all of fixed current ISW.

Similarly, when the complimentary signal CDIG to the base of discharging input transistor Q9 is the low voltage, transistor Q9 turns off, causing transistor Q9 and discharging transistor P3 to provide substantially none of fixed current ISW sunk by current source 128. When the signal CDIG to the base of discharging input transistor Q9 is the high voltage, transistor Q9 turns on, causing transistor Q9 and discharging transistor P3 to provide substantially all of fixed current ISW sunk by current source 128.

Thus, charging input transistor Q8 and charging transistor P2 provide substantially all of fixed current ISW when discharging input transistor Q9 and discharging transistor P3 provide substantially none of fixed current ISW, and substantially none of fixed current ISW when discharging input transistor Q9 and discharging transistor P3 are providing substantially all of fixed current ISW.

The charging stage 114 charges node A at a constant rising slew rate by supplying first charging current ISW1 to charging capacitor C20.

A p-channel charging mirror transistor P1, having its source connected to the power supply VCC, its gate connected to the gate of charging transistor P2, and its drain connected to node A, supplies first charging current ISW1. Because their gates are connected, charging transistor P2 and charging mirror transistor P1 have substantially equivalent gate-to-source voltages. Thus, when the source-to-drain voltage of charging transistor P2 becomes positive and, thus, charging transistor P2 begins to conduct, charging mirror transistor P1 also begins to conduct.

The amount of current conducted by charging mirror transistor P1 is dependent on the relative sizes of the transistors. For example, if as shown in FIGS. 1A and 1B, the area of charging mirror transistor P1 is 5 times larger than the area of charging transistor P2, then transistor P1 will conduct 5 times more current than transistor P2. Thus, when charging input transistor Q8 and charging transistor P2 conduct fixed current ISW, i.e., approximately 320 uA, transistor P1 conducts approximately 1.6 mA (milliamperes).

Capacitor C20, which is connected between node A and ground, holds the voltage present at node A. The capacitance, which is approximately 2.0 pF (picofarads) in the circuit of FIGS. 1A and 1B is selected so that the capacitance provided by capacitor C20 dominates the capacitance provided by the remainder of the charging stage 114 Capacitor C20 is fabricated as a poly to N+ capacitor with no bias dependency.

In operation, when charging input transistor Q8 receives a high voltage input signal DIG and turns on, charging mirror transistor P1 begins to generate first charging current ISW1. As charging mirror transistor P1 generates first charging current ISW1, capacitor C20 begins charging. As capacitor C20 begins charging, the voltage at node A begins rising at a rising slew rate determined by $$\frac{dv}{dt} = \frac{ISW1}{C}$$

Thus, by adjusting the capacitance of capacitor C20, or first charging current ISW1, a rising slew rate may be generated which meets the timing requirements of the output buffer and reduces overshooting and undershooting. In the preferred embodiment of the invention, a rising slew rate of approximately 0.53 v/nS (1.6 mA/3.0 pF) is generated. The additional 1 pF results from the silicon junction loading on node A which is not reflected by capacitor C20.

The charging stage 114 includes bias transistors to insure that charging mirror transistor P1 remains off when charging input transistor Q8 is off. Thus, charging transistor P2 is turned off by n-channel bias transistor N8, n-channel bias mirror transistor N9, p-channel charging bias transistor P9 and p-channel charging bias mirror transistor P8.

Bias transistor N8, the commonly-connected gate and drain of which are connected to the power supply VCC through bias resistor R8, and which has its source connected to ground, generates a bias current Ib and establishes a gate-to-source voltage across bias transistor N8.

Bias mirror transistor N9, which has its gate connected to the commonly-connected gate and drain of bias transistor N8, its source connected to ground, and its drain connected to the commonly-connected gate and drain of charging bias transistor P9, mirrors bias current Ib by pulling an equivalent bias current Ie through charging bias transistor P9. Charging bias transistor P9, which has its commonly-connected gate and drain connected to the drain of bias mirror transistor N9 and its source connected to the power supply VCC, sources the equivalent bias current Ie and establishes a gate-to-source voltage across charging bias transistor P9.

Charging bias mirror transistor P8, which has its gate connected to the commonly-connected gate and drain of charging bias transistor P9, its source connected to the power supply VCC, and its drain connected to the gate and drain of charging transistor P2, generates a low-level steady state charging bias current Icb by mirroring the current flowing through charging bias transistor P9 which forces the source-to-drain voltage across charging transistor P2 to a non-conductive voltage level when charging input transistor Q8 is turned off.

The discharging stage 116 discharges the voltage at node A at a falling slew rate which is substantially equivalent to the rising slew rate of node A by generating a sinking current ISW3, which is equivalent to first charging current ISW1, to discharge capacitor C20. To generate sinking current ISW3, a first discharging current ISW2 must first be generated.

A p-channel discharging mirror transistor P4, which has its source connected to the power supply VCC, its gate connected to the gate of discharging transistor P3, and its drain connected to node B, generates first discharging current ISW2 by having its gate connected to the gate of discharging transistor P3. Because their gates are connected together, discharging transistor P3 and discharging mirror transistor P4 have substantially equivalent gate-to-source voltages. Thus, when the source-to-drain voltage of transistor P3 becomes positive and transistor P3 begins to conduct, transistor P4 also begins to conduct.

The amount of current conducted by discharging mirror transistor P4 is dependent upon the relative sizes of the transistors. For example, if, as shown in FIGS. 1A and 1B, the area of discharging mirror transistor P4 is approximately 6 times larger than the area of discharging transistor P3, then transistor P4 will conduct approximately 6 times more current. Thus, when transistor Q9 and transistor P3 conduct fixed current ISW (approximately 320 uA), discharging mirror transistor P4 conducts approximately 1.9 mA (milliamperes).

A discharging node resistor R4, which is connected between the drain of discharging mirror transistor P4 and ground, conducts a portion of first discharging current ISW2. This small current path keeps high leakage currents from developing in a discharging output transistor Q4 when transistor Q4 is turned off.

A sinking npn transistor Q6, which has its commonly-connected base and collector connected to the drain of discharging mirror transistor P4 and its emitter connected to ground through sinking diode resistor R5, conducts most of first discharging current ISW2 when the base-emitter junction of transistor Q6 becomes forward-biased.

A npn sinking mirror transistor Q5, which has its collector connected to node A, its base connected to the drain of discharging mirror transistor P4, and its emitter connected to ground through sinking mirror resistor R6, generates sinking current ISW3 by having its base connected to the base of sinking transistor Q6. Because their bases are connected together, sinking transistor Q6 and sinking mirror transistor Q5 have substantially equivalent base-to-emitter voltages. Thus, when the base-to-emitter voltage of transistor Q6 becomes forward-biased and transistor Q6 begins to conduct, transistor Q5 also begins to conduct.

The amount of current conducted by sinking mirror transistor Q5 is substantially equal to the current sunk by sinking transistor Q6. In the FIGS. 1A and 1B embodiment of the invention, sinking transistor Q6 sinks approximately 1.6 mA. Thus, when discharging input transistor Q9 and discharging transistor P3 conducts fixed current ISW (approximately 320 uA), discharging mirror transistor P4 conducts approximately 1.9 mA (milliamperes) and sinking mirror transistor Q5 conducts approximately 1.6 mA. The remaining 300 uA is received by the base of discharging output transistor Q4 (see below).

When discharging input transistor Q9 turns on and provides substantially all of fixed current ISW, discharging mirror transistor P4 turns on and generates first discharging current ISW2. Current ISW2 causes sinking mirror transistor Q5 to turn on and generate sinking current ISW3, which discharges capacitor C20. At substantially the same time, charging input transistor Q8 turns off, thereby stopping charging mirror transistor P1 from generating first charging current ISW1.

Thus, by adjusting first discharging current ISW2, a falling slew rate may be generated which is substantially equivalent to the rising slew rate of node A. In the preferred embodiment of the present invention, a falling slew rate of approximately 0.53 v/nS is (1.6 mA/3.0 pF) is generated.

Once the voltage at node A has been reduced to a low voltage, the hold-down stage 118 turns on and pulls the voltage at node A and, thus, the voltage at output node OUT down to approximately 0.5 volts.

The hold-down stage 118 monitors the voltage of node A at the input of a first invertor circuit. The first invertor circuit, which includes a first p-channel transistor P7 which has its source connected to the power supply VCC, and a first n-channel transistor N7 which has its source connected to ground, its gate connected to the gate of p-channel transistor P7 and to node A, and its drain connected to the drain of p-channel transistor P7, generates a high signal HGH when the voltage of node A drops below approximately 1.5 volts.

An n-channel output hold-down transistor N4, which has its gate connected to the drains of p and n-channel transistors P7 and N7, respectively, its drain connected to output node OUT, and its source connected to ground, receives the high signal HGH and, in response, turns on and pulls the output node OUT down to a TTL compatible final low voltage of approximately 0.5 volts.

A n-channel discharging node transistor N3, which has its gate connected to the drains of p and n-channel transistors P7 and N7, respectively, its drain connected to node B, and its source connected to ground, also receives the high signal HGH and, in response, turns on and sinks first discharging current ISW2 remaining on node B.

A second invertor circuit, which includes a p-channel transistor P6 which has its source connected to the power supply VCC, and a n-channel transistor N6 which has its source connected to ground, its gate connected to the gate of p-channel transistor P6 and to node A, and its drain connected to the drain of p-channel transistor P6, also receives the high signal HGH and, in response, generates a low signal LOW.

A p-channel shut-off transistor P5, which has its gate connected to the drains of p and n-channel transistors P6 and N6, respectively, its drain connected to the commonly-connected gate and drain of discharging transistor P3, and its source connected to the power supply VCC, receives the low signal LOW and, in response, turns on and sources fixed current ISW to discharging input transistor Q9.

When shut-off transistor P5 turns on and begins sourcing fixed current ISW, discharging transistor P3 turns off because the voltage drop across shut-off transistor P5 is less than the gate-to-source voltage required to keep discharging transistor P3 on. This forces the source-to-drain voltage across discharging transistor P3 to a non-conductive voltage level.

When transistor P3 turns off, discharging mirror transistor P4 stops generating first discharging current ISW2. When current ISW2 stops, sinking mirror transistor Q5 stops generating sinking current ISW3, thereby stopping the discharge of capacitor C20. A npn discharging output transistor Q4 is also turned off and thereby stops sourcing a second discharge current Id which goes to zero.

To continue discharging capacitor C20 after sinking current ISW3 has been stopped, a n-channel bias mirror transistor N10 generates a hold-down current Ihd. Bias mirror transistor N10, which has its gate connected to the commonly-connected gate and drain of bias transistor N8, its source connected to ground, and its drain connected to node A, attempts to generate hold-down current Ihd by mirroring bias current Ib in bias transistor N8.

The function of resistor R1 and resistor R2 is to give a slight negative temperature coefficient to the multiplied first charging current ISW1 and the multiplied first discharging current ISW2, respectively. As temperature increases, the gate-to-source voltage of transistor P2 and transistor P3 goes up and the voltage drop across resistor R1 and resistor R2 becomes a smaller percentage of the total voltage which either transistor P1 or P4 see as its gate-to-source voltage.

To track the rising slew rate of node A, output stage 120 couples the voltage at node A to a capacitive load at output node OUT through a npn charging output transistor Q1 and a npn discharging output transistor Q4.

Charging output transistor Q1, which has its collector connected to the power supply VCC through current limiting resistor R9, its base connected to node A, and its emitter connected to output node OUT, couples the voltage on node A to the capacitive load at output node OUT through its base-emitter junction. Charging output transistor Q1 is a large output device which is able to source the approximately 20 to 50 mA current required to drive the output load with only a minimal effect on first charging current ISW1. When the voltage at node A rises and the base-emitter junction of transistor Q1 becomes forward-biased, transistor Q1 generates a second charging current Ic which charges the capacitive load to a high voltage at a rate which is determined by the slew rate on node A. For example, if second charging current Ic charged the voltage on the capacitive load at a slower rate than the rate at which the voltage at node A was rising, then the voltage drop across the base-emitter junction of transistor Q1 will begin to increase because the voltage at the emitter of transistor Q1 will not be rising as quickly as the voltage at the base of transistor Q1. As the voltage drop across the base-emitter junction increases, however, second charging current Ic supplied by the collector of transistor Q1 increases, thereby increasing the charge to the capacitive load and increasing the rate at which the voltage at output node OUT increases.

In this manner, the voltage at the emitter of transistor Q1 follows the voltage at the base, minus the original voltage drop associated with the base-emitter junction. Thus, charging output transistor Q1 can generate second charging current Ic which is sufficient to drive the capacitance on the output load through a positive voltage swing.

In the preferred embodiment of the present invention, charging output transistor Q1 will track the rising slew rate at node A independent of the capacitive load at output node OUT for capacitive loads within the range of 15 pF to 65 pF.

Discharging output transistor Q4 provides a second discharging current Id which allows the fall rate of output node OUT to follow the fall rate of node A.

Discharging output transistor Q4, which has its emitter connected to ground through degeneration resistor R7, its collector connected to output node OUT through an output diode-connected npn transistor Q2, and its base connected to node B, generates second discharging current Id by having its base connected to the base of sinking transistor Q6. Because their bases are connected together, sinking transistor Q6 and discharging output transistor Q4 have substantially equivalent base-to-emitter voltages. Thus, when the base-to-emitter voltage of transistor Q6 becomes forward-biased and transistor Q6 begins to conduct, transistor Q4 also conducts.

The amount of current conducted by discharging output transistor Q4 is dependent on the current supplied to its base. In the preferred embodiment of the invention, the base of transistor Q4 receives approximately 300 uA. Thus, when discharging transistor P3 conducts approximately 320 uA (microamperes), discharging mirror transistor P4 conducts approximately 1.9 mA (milliampere) and discharging output transistor Q4 conducts approximately 40 mA.

In order to achieve a fairly accurate multiplication of first discharging current ISW2, discharging output transistor Q4 is designed as two islands (not shown), each island with six emitter stripes and each pair of emitter stripes bounded by double base contacts.

In operation, when discharging output transistor Q4 conducts, a npn tracking transistor Q3, which has its base connected to node A, its collector connected to the power supply VCC, and its emitter connected to the collector of discharging output transistor Q4, limits a node C from falling any faster than node A. Discharging output transistor Q4 demands 40 mA which can come from either output transistor Q2 or npn tracking transistor Q3. If node C starts falling faster than node A, then the base-emitter junction of npn tracking transistor Q3 becomes more forward-biased and conducts more of the 40 mA current, thereby clamping the voltage of node C to that of node A minus the voltage drop across the base-emitter junction. The purpose of output transistor Q2 is to ensure that at the beginning of the output fall ramp, npn tracking transistor Q3 is close to having a forward-biased base-emitter junction.

Initially, output node OUT and node A may have a voltage which is close to the power supply voltage VCC. In this case, node C will have a voltage which is equivalent to the power supply VCC voltage minus the voltage drop across the base-emitter junction. As discharging output transistor Q4 turns on, node C starts to drop and the voltage on output node OUT will follow the voltage on node C. However, node C cannot fall any faster than node A because of the clamping action of npn tracking transistor Q3. This emitter-follower effect is designed for output loadings from 15 pF to 65 pF.

To achieve a constant slew rate over a power supply range of from 4.5 volts to 5.5 volts and an ambient temperature range from −55° C. to +125° C., every current of the buffer 110 is first referenced to fixed current ISW. As shown in FIGS. 1A and 1B, first charging current ISW1 and first discharging current ISW2 are generated by mirroring fixed current ISW. Similarly, sinking current ISW3 is generated by mirroring first discharging current ISW2. Finally, second charging current Ic and second discharging current Id are generated by tracking the voltage at node A which is generated by first charging current ISW1.

Thus, if fixed current ISW can be made to be nearly independent of the surrounding temperature, then, to a first order, then first charging current ISW1, first discharging current ISW2, sinking current ISW3, second charging current Ic, and second discharging current Id will also be nearly independent of ambient temperature and power supply variations.

Fixed current ISW is generated to be nearly independent of temperature by utilizing npn current source transistor Q7 which is driven by a voltage reference signal VREF. Current source transistor Q7, which has its collector connected to the emitters of charging and discharging input transistors Q8 and Q9, and its emitter connected to ground through a first current resistor R3 and a second current resistor R3A connected in parallel, receives the voltage reference signal VREF at its base.

The voltage reference signal VREF is referenced to a temperature independent bandgap voltage (not shown) so that, as the ambient temperature rises and falls, the voltage reference signal VREF decreases and increases, respectively, by a compensating amount so that fixed current ISW is continually generated at a constant current level.

Thus, if fixed current ISW remains constant over changes in the surrounding temperature, fixed current ISW will, therefore, only be dependent on the linear variation of the P+ sheet rho (90 ohm/sq). Since this dependency is small, then, to a first order, fixed current ISW and, therefore the output buffer 110, is nearly independent of changes in the surrounding temperature.

It should be understood that various alternatives to the structures described herein may be employed in practicing the present invention. It is intended that the following claims define the invention and that structures within the scope of these claims and their equivalents be covered thereby.

What is claimed is:

1. A controlled slew rate output buffer that repeats an input signal to an output node of the output buffer, the input signal transitioning from a low voltage level to a high voltage level and transitioning from the high voltage level to the low voltage level, the output buffer comprising:
   (a) an input stage that includes a charging leg and a discharging leg that respond to the input signal by alternately providing a current path for a fixed current from a power supply to a current source;
   (b) a charging stage that responds to the current in the charging leg of the input stage by charging a first node to the high voltage at a rising slew rate that is substantially determined by a magnitude of a first charging current and a capacitance of a capacitor;
   (c) a discharging stage that responds to current in the discharging leg of the input stage by discharging the first node to an intermediate low voltage at a falling slew rate that is substantially equivalent to the rising slew rate of the first node wherein the rising slew rate and the falling slew rate of the first node are substantially constant over a specified temperature range, a specified power supply range, a specified capacitive loading range, and with substantially equal rising and falling slew rates;
   (d) a hold-down stage connected to the first node and that responds to the discharge of the first node to the intermediate low voltage by pulling the first node down to the low voltage and by pulling the output node down to a final low voltage; and
   (e) an output stage connected between the first node and the output node for tracking the rising slew rate and the falling slew rate at the first node during the charging and discharging of the first node such that a rising slew rate and a falling slew rate of an output signal at the output node is substantially equivalent to the rising slew rate and the falling slew rate of the first node.

2. A controlled slew rate output buffer for providing an input signal to an output node, the input signal having a rising edge and a falling edge, the controlled slew rate output buffer comprising:
   input means for generating a charging current in response to the rising edge of the input signal and for generating a discharging current in response to the falling edge of the input signal, the charging current and the discharging current being substantially constant over a temperature range and a power supply voltage range;
   intermediate charging means for charging an intermediate node from a first low voltage to a first high voltage at a first slew rate in response to the charging current so that the first slew rate is substantially constant over the temperature range and the power supply voltage range;
   intermediate discharging means for discharging the intermediate node from the first high voltage to the first low voltage at a second slew rate in response to the discharging current so that the second slew rate is substantially constant over the temperature range and the power supply voltage range;
   output charging means for charging the output node from a second low voltage to a second high voltage at a third slew rate in response to the intermediate node being charged so that the third slew rate is substantially constant over the temperature range, the power supply voltage range, and an output capacitance range and so that the third slew rate is substantially equivalent to the first slew rate; and
   output discharging means for discharging the output node from the second high voltage to the second low voltage at a fourth slew rate in response to the intermediate node being discharged so that the fourth slew rate is substantially constant over the temperature range, the power supply voltage range, and the output capacitance range and so that the fourth slew rate is substantially equivalent to the second slew rate.

3. The controlled slew rate output buffer of claim 2 wherein the input means comprises:
   a first input charging transistor that turns on and sinks the charging current in response to the rising edge of the input signal and that turns off in response to the falling edge of the input signal;
   a second input charging transistor that turns on and sources the charging current in response to the first input charging transistor turning on and that turns off in response to the first input charging transistor turning off;

a first input discharging transistor that turns on and sinks the discharging current in response to the falling edge of the input signal and that turns off in response to the rising edge of the input signal;

a second input discharging transistor that turns on and sources the discharging current in response to the first input discharging transistor turning on and that turns off in response to the first input discharging transistor turning off; and a current source connected to the first input charging transistor, the first input discharging transistor, and a temperature compensated reference voltage, that sinks an independent current that is substantially constant over the temperature range and the power supply voltage range in response to the temperature compensated reference voltage, wherein when the first input charging transistor turns on, the first input charging transistor sources the independent current and when the first input discharging transistor turns on, the first input discharging transistor sources the independent current, thereby making the charging current and the discharging current substantially constant over the temperature range and the power supply voltage range.

4. The controlled slew rate output buffer of claim 3 and further comprising first shut off means connected to the second input charging transistor and the intermediate charging means for insuring that the second input charging transistor remains off when the first input charging transistor turns off and second shut off means connected to the second input discharging transistor and the intermediate discharging means for insuring that the second input discharging transistor turns off when the intermediate node is discharged to the first low voltage.

5. The controlled slew rate output buffer of claim 2 wherein the intermediate charging means comprises:

first multiplying means connected to the intermediate node for generating a multiplied charging current in response to the charging current, the multiplied charging current being substantially a linear function of the charging current; and capacitive means connected to the intermediate node for storing a charge, the capacitive means having a capacitance, wherein the intermediate node is charged from the first low voltage to the first high voltage at the first slew rate by the first multiplying means sourcing the multiplied charging current to the capacitive means and wherein by fixing the capacitance of the capacitive means and by utilizing a multiplied charging current that tracks a temperature and voltage compensated current, the first slew rate is substantially constant over the temperature range and the power supply voltage range.

6. The controlled slew rate output buffer of claim 5 wherein the first multiplying means comprises a first transistor connected to the second input charging transistor as a current mirror.

7. The controlled slew rate output buffer of claim 5 wherein the intermediate discharging means comprises:

second multiplying means for generating a multiplied discharging current in response to the discharging current, the multiplied discharging current being a substantially linear function of the discharging current; and translator means connected to the intermediate node for sinking a translating current in response to the multiplied discharging current, the translating current being a substantially linear function of the multiplied discharging current, wherein the intermediate node is discharged from the first high voltage to the first low voltage at the second slew rate by the translator means sinking the translating current from the capacitive means and wherein by utilizing a multiplied charging current that tracks a temperature and voltage compensated current, the charge on the capacitive means is discharged at a second slew rate that is substantially constant over the temperature range and the power supply voltage range.

8. The controlled slew rate output buffer of claim 7 wherein the second multiplying means comprises a second transistor connected to the second input discharging transistor as a current mirror.

9. The controlled slew rate output buffer of claim 8 wherein the translator means comprises a diode transistor and a mirror transistor connected together as a current mirror.

10. The controlled slew rate output buffer of claim 7 wherein the output charging means comprises:

charging transistor means connected to the output node and the intermediate node for generating an output charging current in response to the intermediate node being charged, the output charging current having a magnitude that is sufficient to charge the output node at the third slew rate that is substantially equivalent to the first slew rate, thereby making the third slew rate substantially constant over the temperature range, the power supply voltage range, and the output capacitance range, wherein the output node is charged from the second low voltage to the second high voltage at the third slew rate by the charging transistor means sourcing the output charging current to the output node.

11. The controlled slew rate output buffer of claim 10 wherein the output discharging means comprises:

discharging transistor means connected to a discharging node and the second multiplying means for sinking an output discharging current in response to the multiplied discharging current, the output discharging current having a magnitude that is sufficient to discharge the output node at the fourth slew rate which is substantially equivalent to the second slew rate, thereby making the fourth slew rate substantially constant over the temperature range, the power supply voltage range, and the output capacitance range; and tracking means connected to the intermediate node, the discharging node, and the output node for sourcing the output discharging current by sinking an intermediate discharging current from the output node and for keeping the fourth slew rate equal to the second slew rate by sourcing a tracking current as a part of the output discharging current being sourced when a voltage at the output node falls faster than a voltage at the intermediate node, wherein the discharging transistor means discharges the output node from the second high voltage to the second low voltage by sinking the intermediate discharging current from the output node through the tracking means as the output discharging current.

12. The controlled slew rate output buffer of claim 11 wherein the tracking means comprises:
tracking transistor means connected to the intermediate node and the discharging node for sourcing the tracking current when a voltage differential between the intermediate node and the output node exceeds a threshold voltage, the tracking current having a magnitude that is sufficient to allow the fourth slew rate to equal the second slew rate; and
diode transistor means connected between the output node and the discharging node for providing a voltage drop, the voltage drop being substantially equivalent to the threshold voltage,
wherein the diode transistor means insures that the tracking means can provide the tracking current when the second high voltage at the output node begins to fall.

13. The controlled slew rate output buffer of claim 10 and further comprising pull down means connected to the output node and the intermediate node for providing that the second low voltage is transistor-transistor-logic compatible.

14. The controlled slew rate output buffer of claim 7 wherein the intermediate discharging means further comprises inverter means connected to the intermediate node for generating a turn-on signal when the voltage at the intermediate node falls below a turn-on voltage.

15. The controlled slew rate output buffer of claim 14 wherein the output charging means comprises:
charging transistor means connected to the output node and the intermediate node for generating an output charging current in response to the intermediate node being charged, the output charging current having a magnitude that is sufficient to charge the output node at a slew rate that is substantially equivalent to the first slew rate, thereby making the third slew rate substantially constant over the temperature range, the power supply voltage range, and the output capacitance range,
wherein the output node is charged from the second low voltage to the second high voltage at the third slew rate by the charging transistor means sourcing the output charging current to the output node.

16. The controlled slew rate output buffer of claim 15 wherein the output discharging means comprises:
first discharging transistor means connected to a discharging node and the second multiplying means for sinking an output discharging current in response to the multiplied discharging current, the output discharging current having a magnitude that is sufficient to discharge the output node at a slew rate which is substantially equivalent to the second slew rate, thereby making the fourth slew rate substantially constant over the temperature range, the power supply voltage range, and the output capacitance range;
second discharging transistor means connected to the output node and the intermediate discharging means for sinking a pull-down current in response to the turn-on signal; and
tracking means connected to the intermediate node, the discharging node, and the output node for sourcing the output discharging current by sinking an intermediate discharging current from the output node and for keeping the fourth slew rate equal to the second slew rate by sourcing a tracking current as a part of the output discharging current being sourced when a voltage at the output node falls faster than a voltage at the intermediate node,
wherein the first discharging transistor means discharges the output node from the second high voltage to an intermediate low voltage by sinking the intermediate discharging current from the output node through the tracking means as the output discharging current, and
wherein the second discharging transistor means discharges the output node from the intermediate low voltage to the second low voltage by sinking the pull-down current from the output node.

17. The controlled slew rate output buffer of claim 16 wherein the tracking means comprises:
tracking transistor means connected to the intermediate node and the first discharging node for sourcing the tracking current when a voltage differential between the intermediate node and the output node exceeds a threshold voltage, the tracking current having a magnitude that is sufficient to allow the fourth slew rate to equal the second slew rate; and
diode transistor means connected between the output node and the first discharging node for providing a voltage drop, the voltage drop being substantially equivalent to the threshold voltage,
wherein the diode transistor means insures that the tracking means can provide the tracking current when the second high voltage at the output node begins to fall.

18. The controlled slew rate output buffer of claim 2 wherein the second slew rate is substantially equivalent to the first slew rate.

19. The controlled slew rate output buffer of claim 18 wherein the input means comprises:
a first input charging transistor that turns on and sinks the charging current in response to the rising edge of the input signal and that turns off in response to the falling edge of the input signal;
a second input charging transistor that turns on and sources the charging current in response to the first input charging transistor turning on and that turns off in response to the first input charging transistor turning off;
a first input discharging transistor that turns on and sinks the discharging current in response to the falling edge of the input signal and that turns off in response to the rising edge of the input signal;
a second input discharging transistor that turns on and sources the discharging current in response to the first input discharging transistor turning on and that turns off in response to the first input discharging transistor turning off; and
a current source connected to the first input charging transistor, the first input discharging transistor, and a temperature compensated reference voltage, that sinks an independent current that is substantially constant over the temperature range and the power supply voltage range in response to the temperature compensated reference voltage,
wherein when the first input charging transistor turns on, the first input charging transistor sources the independent current and when the first input discharging transistor turns on, the first input discharging transistor sources the independent current, thereby making the charging current and the discharging current substantially constant over the temperature range and the power supply voltage range.

20. The controlled slew rate output buffer of claim 19 and further comprising first shut off means connected to the second input charging transistor and the intermediate charging means for insuring that the second input charging transistor remains off when the first input charging transistor turns off and second shut off means connected to the second input discharging transistor and the intermediate discharging means for insuring that the second input discharging transistor turns off when the intermediate node is discharged to the first low voltage.

21. The controlled slew rate output buffer of claim 18 wherein the intermediate charging means comprises:
first multiplying means connected to the intermediate node for generating a multiplied charging current in response to the charging current, the multiplied charging current being substantially a linear function of the charging current; and
capacitive means connected to the intermediate node for storing a charge, the capacitive means having a capacitance,
wherein the intermediate node is charged from the first low voltage to the first high voltage at the first slew rate by the first multiplying means sourcing the multiplied charging current to the capacitive means and wherein by fixing the capacitance of the capacitive means and by utilizing a multiplied charging current that tracks a temperature and voltage compensated current, the first slew rate is substantially constant over the temperature range and the power supply voltage range.

22. The controlled slew rate output buffer of claim 21 wherein the first multiplying means comprises a first transistor connected to the second input charging transistor as a current mirror.

23. The controlled slew rate output buffer of claim 21 wherein the intermediate discharging means comprises:
second multiplying means for generating a multiplied discharging current in response to the discharging current, the multiplied discharging current being a substantially linear function of the discharging current;
translator means connected to the intermediate node for sinking a translating current in response to the multiplied discharging current, the translating current being substantially equal to the multiplied discharging current, and
inverter means connected to the intermediate node for generating a turn-on signal when the voltage at the intermediate node falls below a turn-on voltage,
wherein the intermediate node is discharged from the first high voltage to the first low voltage at the second slew rate by the translator means sinking the translating current from the capacitive means and wherein by utilizing a multiplied charging current that tracks a temperature and voltage compensated current, the charge on the capacitive means is discharged at a second slew rate that is substantially constant over the temperature range and the power supply voltage range.

24. The controlled slew rate output buffer of claim 23 wherein the second multiplying means comprises a second transistor connected to the second input discharging transistor as a current mirror.

25. The controlled slew rate output buffer of claim 24 wherein the translator means comprises a diode transistor and a mirror transistor connected together as a current mirror.

26. The controlled slew rate output buffer of claim 23 wherein the output charging means comprises:
charging transistor means connected to the output node and the intermediate node for generating an output charging current in response to the intermediate node being charged, the output charging current having a magnitude that is sufficient to charge the output node at the third slew rate that is substantially equivalent to the first slew rate, thereby making the third slew rate substantially constant over the temperature range, the power supply voltage range, and the output capacitance range,
wherein the output node is charged from the second low voltage to the second high voltage at the third slew rate by the charging transistor means sourcing the output charging current to the output node.

27. The controlled slew rate output buffer of claim 26 wherein the output discharging means comprises:
first discharging transistor means connected to a discharging node and the second multiplying means for sinking an output discharging current in response to the multiplied discharging current, the output discharging current having a magnitude that is sufficient to discharge the output node at the fourth slew rate which is substantially equivalent to the second slew rate, thereby making the fourth slew rate substantially constant over the temperature range, the power supply voltage range, and the output capacitance range;
second discharging transistor means connected to the output node and the intermediate discharging means for sinking a pull-down current in response to the turn-on signal; and
tracking means connected to the intermediate node, the discharging node, and the output node for sourcing the output discharging current by sinking an intermediate discharging current from the output node and for keeping the fourth slew rate equal to the second slew rate by sourcing a tracking current as a part of the output discharging current being sourced when a voltage at the output node falls faster than a voltage at the intermediate node,
wherein the first discharging transistor means discharges the output node from the second high voltage to an intermediate low voltage by sinking the intermediate discharging current from the output node through the tracking means as the output discharging current, and
wherein the second discharging transistor means discharges the output node from the intermediate low voltage to the second low voltage by sinking the pull-down current from the output node.

28. The controlled slew rate output buffer of claim 27 wherein the tracking means comprises:
tracking transistor means connected to the intermediate node and the discharging node for sourcing the tracking current when a voltage differential between the intermediate node and the output node exceeds a threshold voltage, the tracking current having a magnitude that is sufficient to allow the fourth slew rate to equal the second slew rate; and
diode transistor means connected between the output node and the discharging node for providing a voltage drop, the voltage drop being substantially equivalent to the threshold voltage,
wherein the diode transistor means insures that the tracking means can provide the tracking current when the second high voltage at the output node begins to fall.

* * * * *